United States Patent [19]

Schnabel

[11] Patent Number: 5,268,650
[45] Date of Patent: Dec. 7, 1993

[54] AMPLIFIER CIRCUIT WITH BIPOLAR AND FIELD-EFFECT TRANSISTORS

[75] Inventor: Jügen Schnabel, Ilsfeld, Fed. Rep. of Germany

[73] Assignee: ALCATEL N.V., The Netherlands, Amsterdam, Netherlands

[21] Appl. No.: 947,179

[22] Filed: Sep. 18, 1992

[30] Foreign Application Priority Data

Sep. 27, 1991 [DE] Fed. Rep. of Germany ....... 4132219

[51] Int. Cl.⁵ .............................................. H03F 3/04
[52] U.S. Cl. ................................... 330/300; 330/151; 330/311
[58] Field of Search ................. 330/151, 300, 310, 311

[56] References Cited

U.S. PATENT DOCUMENTS 4,728,903  3/1988  Reiffin ............................. 330/300 X
5,012,134  4/1991  Kimura .................................. 307/466

FOREIGN PATENT DOCUMENTS 2816314  10/1978  Fed. Rep. of Germany .
2219162  11/1989  United Kingdom .

OTHER PUBLICATIONS

U. Tietze and Ch. Schenk, "Halbleiter-Schaltungstechnik" [Semiconductor Circuit Technology] Eighth Ed., 1986, Springer Verlag [Publishers], pp. 142 and 143, Germany.
Wirsum, "FETS und VMOs" published by Franzis', ISBN 3-7723-6741-0, pp. 90 and 91, 1980 in Germany.

*Primary Examiner*—James B. Mullins
*Attorney, Agent, or Firm*—Frishauf, Holtz, Goodman & Woodward

[57] ABSTRACT

An amplifier circuit (1) has an input stage (2), at least one intermediate stage (3) and an output stage (4). MOSFET transistors are used in the at least one intermediate stage (3), and bipolar transistors are used in the input and output stage (2, 4). A very high amplification with small offset voltage and little noise can be attained.

9 Claims, 1 Drawing Sheet

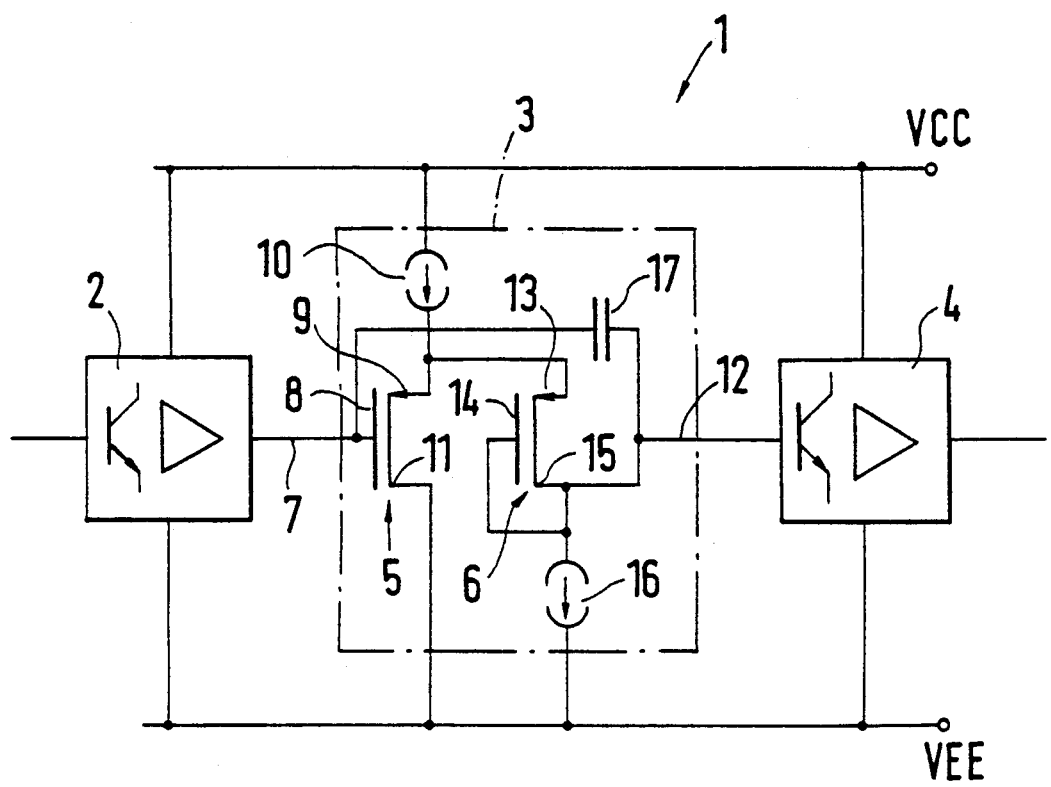

AMPLIFIER CIRCUIT WITH BIPOLAR AND FIELD-EFFECT TRANSISTORS

FIELD OF THE INVENTION

The present invention relates to an amplifier circuit having an input stage, an output stage, and at least one intermediate stage connected between said output stage.

DESCRIPTION OF THE PRIOR ART

An amplifier of the type having at least one intermediate stage connected between an input stage and an output stage is known, for example, from the reference book by Wirsum entitled "FETS and VMOs" published by Franzis', ISBN 3-7723-6741-0, pages 90 and 91, the entire contents of which is incorporated herein by reference. Field-effect transistors are provided in this prior art amplifier, in the input stage (which is a difference amplifier) of a four-stage operational amplifier that is constructed of discrete components as described by Wirsum on pages 90 and 91. The transistors of the remaining stages are bipolar transistors. This arrangement in the Wirsum amplifier results in a very high input impedance, low input current and little inherent noise, particularly at higher frequencies or high source impedances.

In connection with monolithic integrated operational amplifiers, it is furthermore known from the publication by U. Tietze and Ch. Schenk entitled "Halbleiter-Schaltungstechnik" [Semiconductor Circuit Technology], Eighth Ed., 1986, Springer Verlag [Publishers], printed in Germany, pages 142 and 143, the entire contents of pages 142 and 143 being incorporated herein by reference, to construct only the input stage of the amplifier from junction gate field-effect transistors (using BIFET technology) or from metal-oxide semiconductor field-effect transistors (hereinafter termed MOSFETs) using BIMOS technology or to construct the entire operational amplifier exclusively from MOSFETs using CMOS technology.

Amplifier input stages using field-effect transistors have a very high input resistance and only require a very small input current, as a result of which the input offset current can be disregarded for all practical purposes. However, with respect to the input offset voltage as well as the noise voltage at low frequencies, field-effect transistors are disadvantageous, compared with bipolar input stages. Also, since the slope of bipolar transistor amplification is greater then for field-effect transistors, a higher voltage amplification becomes possible using bipolar transistors in the input stage.

SUMMARY OF THE INVENTION

The object of the present invention is to provide a circuit for an amplifier, in particular, an operational amplifier, which provides very high amplification of the input signal with low currents while, at the same time, not increasing the offset voltage drift, but instead reducing it, if possible.

This object is attained by providing an amplifier circuit comprising:
an input stage, at least one intermediate stage, and an output stage;
a plurality of bipolar transistors and at least one metal-oxide semiconductor field-effect transistor (MOSFET) mounted therein;
said input stage and said output stage having at least one of said plurality of bipolar transistors therein;
said at least one intermediate stage including said at least one MOSFET connected to operate in a common-drain configuration, and said at least one MOSFET having a gate electrode connected to an output of said input stage.

Because of the very high input resistance of the intermediate stage, and because the at least one MOSFET is operated in a common-drain configuration, for example, having a resistance greater than $10^{12}\Omega$, the input stage is not loaded by constant current, not even when the output stage has a low input resistance. Thus, in the present invention, very high constant current amplification factors can be attained by means of the input stage along with comparatively low base currents. In the present invention the total constant current amplification is increased and the input bias and offset currents are reduced.

In addition, the use of an additional MOSFET, in the present invention, which is operated as a resistor circuit, downstream of the at least one MOSFET results in an intermediate stage operating as an almost ideal voltage follower. In the same way, in the present invention, the effective offset voltage at the input, which uses bipolar transistors in the input stage, is considerably more advantageous than when using field-effect transistors. Additionally, the offset voltage of the present invention is also reduced by the higher amplification of the input stage, which reduces the offset effects of successive stages, as well as other effects.

BRIEF DESCRIPTION OF THE DRAWINGS

The single drawing figure shows an amplifier circuit diagram in accordance with the invention.

DETAILED DESCRIPTION

The amplifier circuit 1 is a three-stage amplifier with an input stage 2, an intermediate stage 3 and an output stage 4. The input stage 2 and the output stage 4 comprise transistors made in accordance with bipolar technology, as indicated by each of the transistor symbols shown in stages 2 and 4 in the drawing.

The intermediate stage 3 comprises MOSFETs 5 and 6 produced by using a metal-oxide semiconductor (MOS) technology. An output 7 of the input stage 2 is connected with a gate 8 of the MOSFET 5 operated in a common-drain configuration. The source electrode 9 of MOSFET 5 is connected via a constant current source 10 to the operational voltage VCC and the drain electrode 11 of MOSFET 5 is connected to another potential VEE (which may be a ground potential). Because of this, the intermediate stage 3 has an almost infinitely large input resistance for low frequencies and a constant current. As a result, the input stage 2 is not loaded at all by a constant current, even if the stage connected to the output 12 of the intermediate stage 3, in this case, the output stage 4, has a very low input resistance. The input stage 2 can therefore attain a very high amplification factor, which results in high total d.c. potential amplification with, at the same time, low offset currents and offset voltages, for example, resulting from temperature drift.

In a practical manner, the second MOSFET 6, which preferably is operated as a resistance circuit, is connected downstream of the MOSFET 5 that is operated in a common-drain configuration. The source electrode 13 of MOSFET 6 is connected with the source electrode 9 of the first MOSFET 5. The gate electrode 14 as well as the drain electrode 15 of MOSFET 6 are connected with each other and connected with the potential VEE (which may be ground) via a constant current source 16. Because of this structure, a potential displacement results at the output 12 of intermediate stage 3 with respect to the voltage present at the source electrodes 9 and 13, and the intermediate stage 3 acts as an almost ideal voltage follower. The very small error arising because of the different drain-source voltages of the two MOSFETs 5 and 6 leads to a small offset voltage. The offset voltage only makes itself felt at the input because the offset voltage is divided by the high amplification factor of the input stage 2 (offset voltage at the input=offset voltage of the circuit that is the amplification up to this point). The effects of scattering and tolerances are also correspondingly reduced in the subsequent stages (e.g., output stage 4) by the attained amplification gain, so that a reduction of the effective offset voltage at the input is attained.

The bias and offset current at the input can be reduced even more drastically. Because of the uncoupling, with respect to constant current of the input stage 2, it is possible to operate input stage 2 with a considerably lower current, because of which the base currents of the transistors of the input stage 2, and thus the input currents, are also correspondingly scaled down. Although it is possible to realize even lower input currents with field-effect transistors (FETs) in the input stage 2, for physical reasons, FETs have considerably higher offset voltages and greater noise at low frequencies (1/f noise).

A capacitor 17 can be connected in the intermediate stage 3 between the gate electrode 8 of the MOSFET 5 and the drain electrode 15 of the MOSFET 6. Capacitor 17 short-circuits the input 7 and the output 12 of the intermediate stage 3 at higher frequencies. The capacitance of the capacitor 17 is preferably in the range of a few picofarads.

In place of the three-stage amplifier described above, it is also possible to provide a multi-stage amplifier with additional stages, where transistors made in accordance with MOSFET technology are employed in an intermediate stage, but where the prior and subsequent stages are constructed in accordance with bipolar technology.

The circuit produced in accordance with the invention makes possible an almost ideal combination of the advantages of bipolar technology, namely large slope, low offset voltage, low 1/f noise, with the advantages of MOS technology, namely an extremely high input resistance. Both bipolar and MOS technologies can be employed side-by-side as so-called BICMOS technology in the production of circuits on a semiconductor substrate. At the same time, the capacitor 17 can also be produced in accordance with one of Bipolar and MOS processes, known per se, on the same semiconductor substrate.

It is obvious that various changes and modifications may be made, to the amplifier circuit of the present invention, within the scope of the inventive concept of the present invention as defined in the appended claims.

I claim:

1. An amplifier circuit comprising:
   an input stage coupled to at least one intermediate stage, said intermediate stage being coupled to an output stage; and
   a plurality of bipolar transistors and at least two like-type metal-oxide semiconductor field-effect transistors included in said stages of said amplifier circuit;
   said input stage and said output stage respectively having at least one of said plurality of bipolar transistors provided therein;
   said at least one intermediate stage including said at least two metal-oxide semiconductor field-effect transistors provided therein;
   said at least two metal-oxide semiconductor field-effect transistors being connected to operate in a common drain configuration;
   a gate electrode of at least one of said at least two metal-oxide semiconductor field-effect transistors being coupled to an output of said input stage; and wherein:
   said at least two metal-oxide semiconductor field-effect transistors are connected to each other;
   a first of said at least two metal-oxide semiconductor field-effect transistors having an output;
   a second of said at least two metal-oxide semiconductor field-effect transistors being connected to said output of said first metal-oxide semiconductor field-effect transistor; and
   said second metal-oxide semiconductor field-effect transistor is operated as a resistor.

2. An amplifier circuit as claimed in claim 1, wherein:
   a source electrode of said second metal-oxide semiconductor field-effect transistor is connected to a source electrode of said first metal-oxide semiconductor field-effect transistor; and
   a drain electrode and a gate electrode of said second metal-oxide semiconductor field-effect transistor are connected to an input of said output stage.

3. An amplifier circuit as claimed in claim 2, wherein at least one of said source electrode of said first metal-oxide semiconductor field-effect transistor and said source electrode of said second metal-oxide semiconductor field-effect transistor are connected through a constant-current source to a first terminal of a supply-voltage source.

4. An amplifier circuit as claimed in claim 3, wherein said gate and drain electrodes of said second metal-oxide semiconductor field-effect transistor are connected through an additional constant-current source to a second terminal of said supply-voltage source.

5. The amplifier circuit as claimed in claim 4, wherein a capacitor is connected between said gate electrode of said first metal-oxide semiconductor field-effect transistor and an output terminal of said intermediate stage.

6. An amplifier circuit as claimed in claim 5, wherein all said stages of said amplifier, including said capacitor are provided on a common semiconductor substrate.

7. The amplifier circuit as claimed in claim 4, wherein a drain electrode of said first metal-oxide semiconductor field-effect transistor is connected to said second terminal of said supply-voltage source.

8. The amplifier circuit as claimed in claim 7, wherein said second terminal of said supply-voltage source provides a ground potential.

9. An amplifier circuit as claimed in claim 1, wherein said gate electrode of said at least one of said at least two metal-oxide semiconductor field-effect transistor is connected through a capacitor to an output terminal of said intermediate stage.

* * * * *